(12) United States Patent
Shan (10) Patent No.: US 11,004,415 B2
(45) Date of Patent: May 11, 2021

(54) SHIFT REGISTER CIRCUIT AND DISPLAY PANEL USING THE SAME

(71) Applicant: HKC Corporation Limited, Shuitian Village (CN)

(72) Inventor: Jianfeng Shan, Shenzhen (CN)

(73) Assignee: HKC Corporation Limited, Shenzhen (CN)

( * ) Notice: Subject to any disclaimer, the term of this patent is extended or adjusted under 35 U.S.C. 154(b) by 206 days.

(21) Appl. No.: 16/068,415

(22) PCT Filed: Jan. 22, 2018

(86) PCT No.: PCT/CN2018/073603
§ 371 (c)(1),
(2) Date: Jul. 6, 2018

(87) PCT Pub. No.: WO2019/127769
PCT Pub. Date: Jul. 4, 2019

(65) Prior Publication Data
US 2019/0197974 A1    Jun. 27, 2019

(30) Foreign Application Priority Data

Dec. 26, 2017    (CN) .......................... 201711436056.1

(51) Int. Cl.
*G11C 19/00* (2006.01)
*G09G 3/36* (2006.01)
(Continued)

(52) U.S. Cl.
CPC ............. *G09G 3/3677* (2013.01); *G09G 3/20* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS 10,008,170 B2 *   6/2018  Wang .................. G09G 3/3677
2010/0109738 A1 * 5/2010  Chien ................. G09G 3/3677
                                                                327/295
(Continued)

FOREIGN PATENT DOCUMENTS

CN      104715734 A    6/2015
CN      104732939 A    6/2015
KR      20140079106 A  6/2014

*Primary Examiner* — Tuan T Lam
(74) *Attorney, Agent, or Firm* — Muncy, Geissler, Olds & Lowe, P.C.

(57) ABSTRACT

A shift register comprises: a first switch electrically coupled to a control signal, and to a first node; a second switch electrically coupled to the first node, to a frequency signal, and to a first output signal; a third switch electrically coupled to a second node, to the first output signal, and to a low predetermined voltage level; a fourth switch electrically coupled to a second output signal, to the first node, and to the low predetermined voltage level; a fifth switch electrically coupled to the first node, to the frequency signal, and to a third node; and a pull-down control circuit electrically coupled to the frequency signal, the low predetermined voltage level and the second node.

16 Claims, 9 Drawing Sheets (51) Int. Cl.
*G11C 19/28* (2006.01)
*G09G 3/20* (2006.01)
(52) U.S. Cl.
CPC .............. *G09G 2310/0286* (2013.01); *G09G 2310/0291* (2013.01); *G09G 2310/08* (2013.01)

(56) References Cited

U.S. PATENT DOCUMENTS

| | | | |
|---|---|---|---|
| 2010/0277206 A1* | 11/2010 | Lee | G09G 3/3677 327/108 |
| 2015/0043703 A1* | 2/2015 | Tan | G11C 19/28 377/68 |
| 2015/0279288 A1* | 10/2015 | Dai | G02F 1/13306 345/690 |
| 2016/0307641 A1* | 10/2016 | Zheng | G09G 3/3677 |
| 2017/0186398 A1* | 6/2017 | Du | G09G 5/003 |
| 2018/0090087 A1* | 3/2018 | Shi | G09G 3/3648 |
| 2018/0277043 A1* | 9/2018 | Li | G11C 19/28 |
| 2019/0019469 A1* | 1/2019 | Lv | G09G 3/3696 |

* cited by examiner

SHIFT REGISTER CIRCUIT AND DISPLAY PANEL USING THE SAME

BACKGROUND OF THE INVENTION

Field of the Invention

The present invention generally relates to a display technology field, and especially relates to a shift register circuit and display panel using the same.

Description of Related Art

In a modern technology development trend, flat LCD displays are more and more popular. The flat LCD displays have a benefit of a thin and light panel structure. The known driving circuit of the flat LCD display is mainly an external IC outside the display, and this outside IC design is not cost effective nor capable of making the displays thinner.

An LCD display usually includes a gate driving circuit, a source driving circuit, and a pixel array. There are a plurality of pixel circuits in the pixel array, wherein each pixel circuit turns on and off according to a scan signal provided by the gate driving circuit, and shows a data image according to a data signal provided by the source driving circuit. The gate driving circuit usually includes a plurality of shift registers, wherein a scan signal is generated from the shift register at one stage to the shift register at a next stage, and is outputted to the pixel array to sequentially turn on the pixel circuit to receive a data signal.

Currently, in a manufacturing process of the driving circuits, the gate driving circuit is developed to be directly built on an array substrate (named Gate On Array technology, GOA), to replace a driving chip by an externally connected IC. This GOA technique can be applied on an edge of an LCD panel, for reducing the production steps and cost, to make the panel (LCD display) thinner. In the GOA technique, the pull-down speed of the gate control signal controlled by the shift register, often affects a driving effect of the gate control signal on the pixel array. And, due to that a frequency signal coupled to the shift register is a periodic signal, a plurality of switches in the shift register will be misoperated during turning on and off, even though the switches are off, to display an abnormal image of the LCD display apparatus.

SUMMARY OF THE INVENTION

For resolving the technical problems above-mentioned, the objects of the present invention are to provide a shift register circuit and a display panel using the same.

The objects and technical solutions of the present invention are implemented by following technical ways and means. In one perspective, the present invention provides a shift register circuit comprising a plurality of shift registers. Each shift register comprises: a first switch including a control end and a first end electrically coupled to a control signal, and a second end electrically coupled to a first node; a second switch including a control end electrically coupled to the first node, a first end electrically coupled to a frequency signal, and a second end electrically coupled to a first output signal; a third switch including a control end electrically coupled to a second node, a first end electrically coupled to the first output signal, and a second end electrically coupled to a low predetermined voltage level; a fourth switch including a control end electrically coupled to a second output signal, a first end electrically coupled to the first node, and a second end electrically coupled to the low predetermined voltage level; a fifth switch including a control end electrically coupled to the first node, a first end electrically coupled to the frequency signal, and a second end electrically coupled to a third node; and a pull-down control circuit electrically coupled to the frequency signal, the low predetermined voltage level and the second node.

In one embodiment of the present invention, the pull-down control circuit further comprises: a sixth switch including a control end and a first end electrically coupled to the second output signal, and a second end electrically coupled to the second node.

In one embodiment of the present invention, the pull-down control circuit further comprises: a seventh switch including a control end electrically coupled to a fourth node, a first end electrically coupled to the second node, and a second end electrically coupled to the low predetermined voltage level.

In one embodiment of the present invention, the pull-down control circuit further comprises: a first capacitor electrically coupled to the frequency signal and the second node.

In one embodiment of the present invention, the first capacitor stores electric charge for maintaining the voltage level of the second node at a voltage level.

In one embodiment of the present invention, the shift register further comprises: a sub-pull-down circuit electrically coupled to the first node, the first output signal, and the low predetermined voltage level of the shift register.

In one embodiment of the present invention, the shift register further comprises: a sub-pull-down circuit controller electrically coupled to the sub-pull-down circuit and the low predetermined voltage level of the shift register.

In one embodiment of the present invention, the pull-down control circuit is used for controlling an operation status of the fourth switch to eliminate an interference signal of the shift register.

The objects and technical solutions of the present invention can be further implemented by following technical ways and means.

In another perspective, the present invention provides a shift register circuit comprising a plurality of shift registers. Each shift register comprises: a first switch including a control end and a first end electrically coupled to a control signal, and a second end electrically coupled to a first node; a second switch including a control end electrically coupled to the first node, a first end electrically coupled to a frequency signal, and a second end electrically coupled to a first output signal; a third switch including a control end electrically coupled to a second node, a first end electrically coupled to the first output signal, and a second end electrically coupled to a low predetermined voltage level; a fourth switch including a control end electrically couple to a second output signal, a first end electrically coupled to the first node, and a second end electrically coupled to the low predetermined voltage level; a fifth switch including a control end electrically coupled to the first node, a first end electrically coupled to the frequency signal, and a second end electrically coupled to a third node; and a pull-down control circuit. The pull-down control circuit comprises: a sixth switch including a control end and a first end electrically coupled to the second output signal, and a second end electrically coupled to the second node; a seventh switch including a control end electrically coupled to a fourth node, a first end electrically coupled to the second node, and a second end electrically coupled to the low predetermined voltage level; and a first capacitor electrically coupled to the frequency signal and the second node; wherein an operation status of the fourth switch is controlled and an interference signal of the shift register is eliminated through the pull-down control circuit.

In another perspective, the present invention provides a display panel comprising a shift register circuit implemented by all of the technical ways and means above-mentioned.

The present invention uses a pull-down control circuit and coupling effects of a frequency signal to form a switch signal for controlling the operation status of the active switch, so that an interference signal in circuits can be eliminated to avoid displaying an abnormal image.

DESCRIPTION OF THE PREFERRED EMBODIMENTS

The drawings as referred to following embodiments throughout the description of the present invention are examples for implementing the objects of the present invention. The orientation words or terms used in the description of the present invention, such as "above", "under", "forward", "backward", "left", "right", "inner", "outer", and "side", are examples in the drawings for illustrative purpose only, or just show the interrelations between the components, but not to be construed as limitations to the scope of the present invention.

The drawings and the description of the present invention are deemed to be examples but not limitations essentially. In the drawings, components or elements having similar or same structure are marked with the same numbers. In addition, sizes and thicknesses of every component or element are just examples, but not drawn according to the actual scale and not read as limitations to the scope of the present invention.

Furthermore, in the description of the present invention, a word "comprising" or "including" is construed to comprise or include the related components, but not exclude other components, except there is clearly opposite word or description in the present invention. And, in the description of the present invention, a word "on" can be construed to be above or under a target component, but not only construed to be on a top of the target component in vertical or gravity direction.

For further clarifying the technical solutions or functions of the present invention to implement the objects of the present invention, a shift register circuit and a display panel using the same, and their specific implementations, structures, features and functions, according to a preferred embodiment of the present invention will be apparent from the following detailed description, which proceeds with reference to the accompanying drawings.

Figure 1:
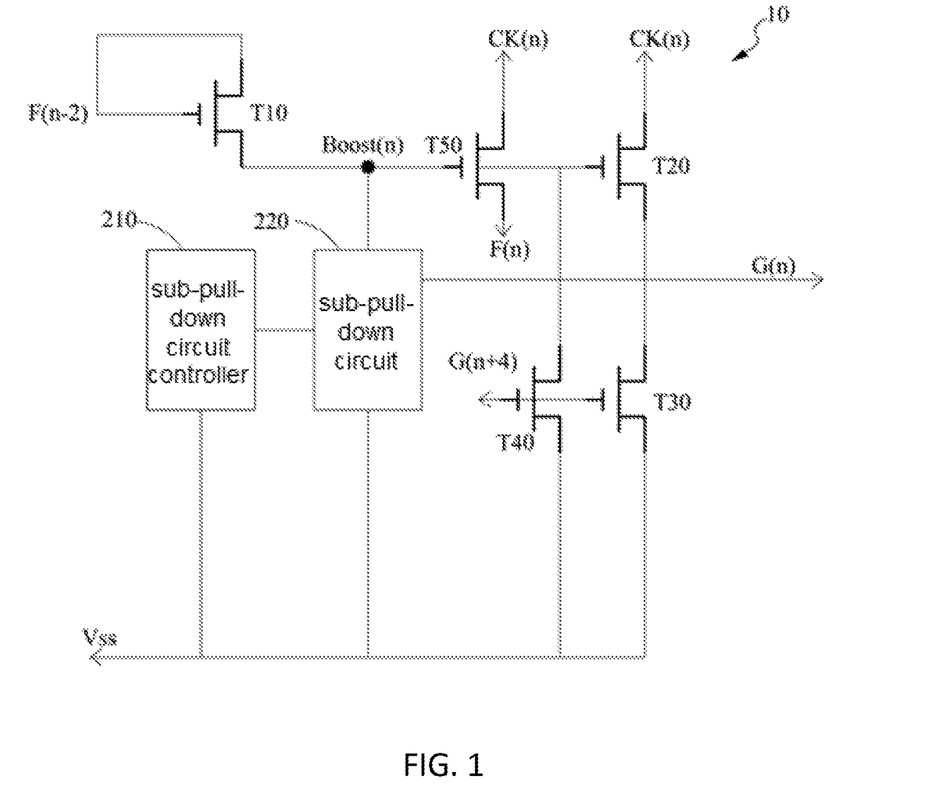
FIG. 1 shows an exemplary shift register circuit of a display panel.

FIG. 1 shows an exemplary shift register circuit of a display panel. Please refer to FIG. 1, an exemplary shift register circuit 10 comprises a plurality of shift registers, wherein each shift register comprises: a first switch T10 wherein the first switch T10 includes a control end and a first end electrically coupled to a control signal F(n−2), and a second end electrically coupled to a first node Boost(n); a second switch T20, wherein the second switch T20 includes a control end electrically coupled to the first node Boost(n), a first end electrically coupled to a frequency signal CK(n), and a second end electrically coupled to a first output signal G(n); a third switch T30, wherein the third switch T30 includes a control end electrically coupled to a second output signal G(n+4), a first end electrically coupled to the first output signal G(n), and a second end electrically coupled to a low predetermined voltage level Vss; a fourth switch T40, wherein the fourth switch T40 includes a control end electrically coupled to the second output signal G(n+4), a first end electrically coupled to the control end of the second switch T20, and a second end electrically coupled to the low predetermined voltage level Vss; a fifth switch T50, wherein the fifth switch T50 includes a control end electrically coupled to the first node Boost(n), a first end electrically coupled to the frequency signal CK(n), and a second end electrically coupled to a third node F(n); a sub-pull-down circuit 220 electrically coupled to the first node Boost(n), the first output signal G(n) and the low predetermined voltage level Vss of the shift register; and a sub-pull-down circuit controller 210 electrically coupled to the sub-pull-down circuit 220 and the low predetermined voltage level Vss of the shift register.

Figure 2:
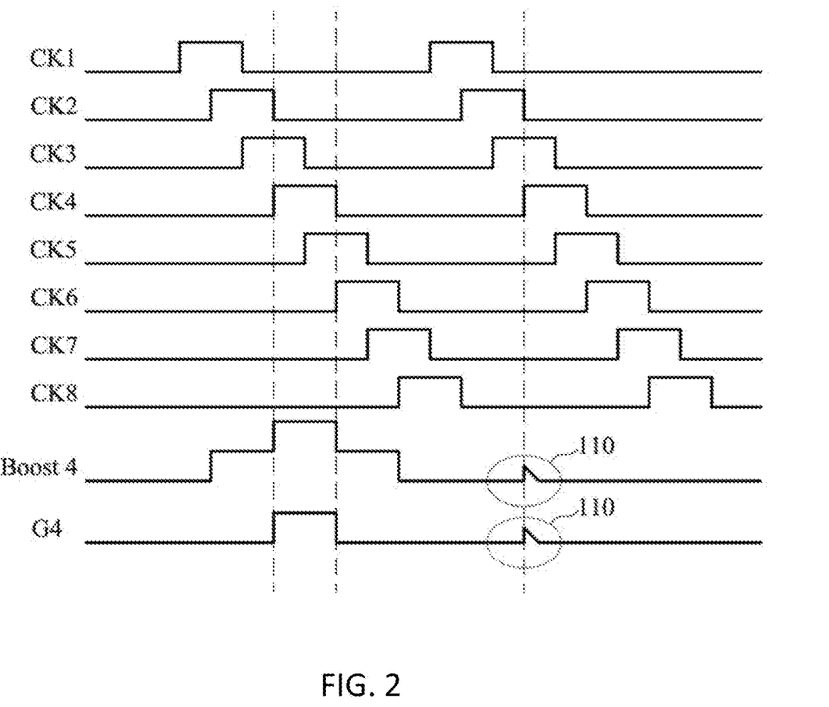
FIG. 2 shows an exemplary waveform diagram of a shift register circuit.

FIG. 2 shows an exemplary waveform diagram of a shift register circuit. Please refer to FIGS. 1 and 2, since the frequency signal CK(n) is a periodic signal, even though the first output signal G(n) is not outputted, the frequency signal CK(n) may couple to the first node Boost(n) to generate an interference signal 110 and result in a misoperated first output signal G(n). As shown in FIG. 2, the first node Boost4 generates an interference signal 110 to result in a misoperated G4, so that an abnormal image is displayed.

Figure 3:
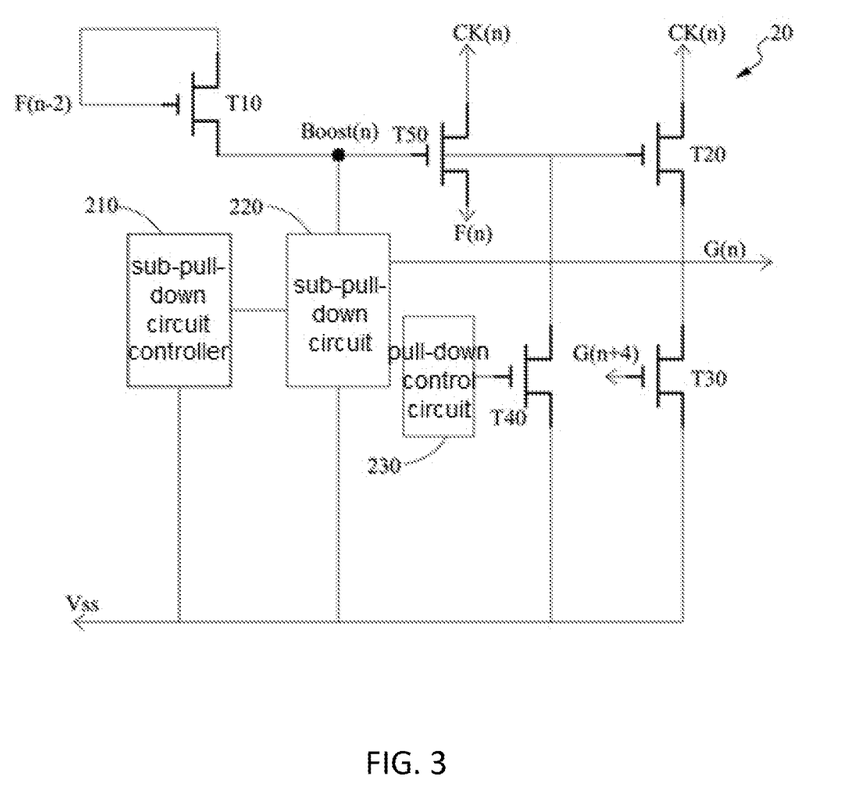
FIG. 3 shows a shift register circuit according to an embodiment of the present invention.
Figure 4:
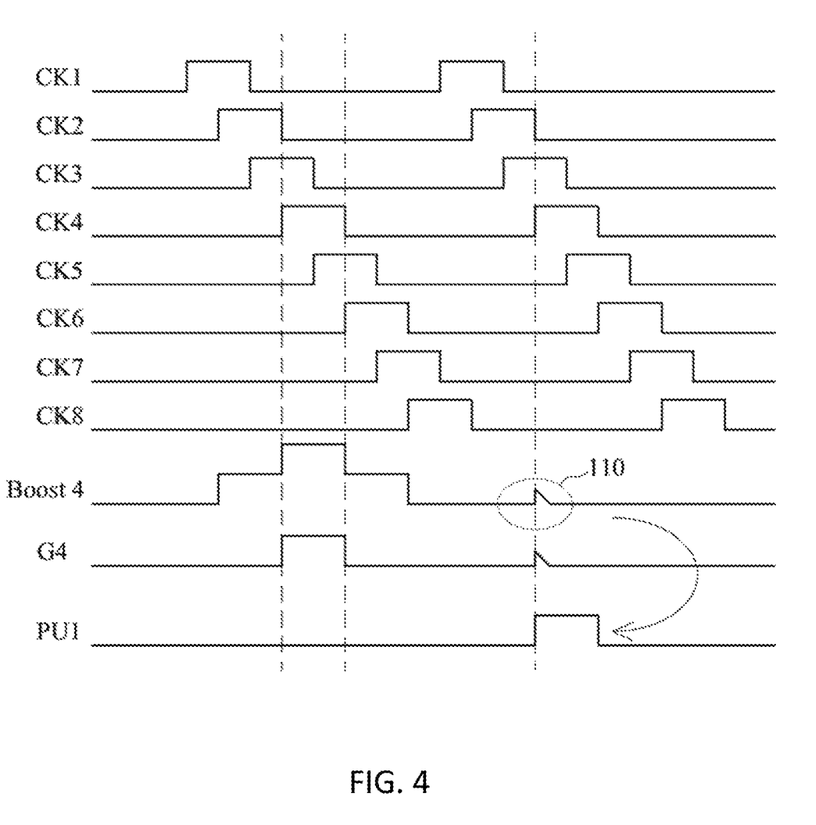
FIG. 4 shows a waveform diagram of a shift register circuit according to an embodiment of the present invention.
Figure 5:
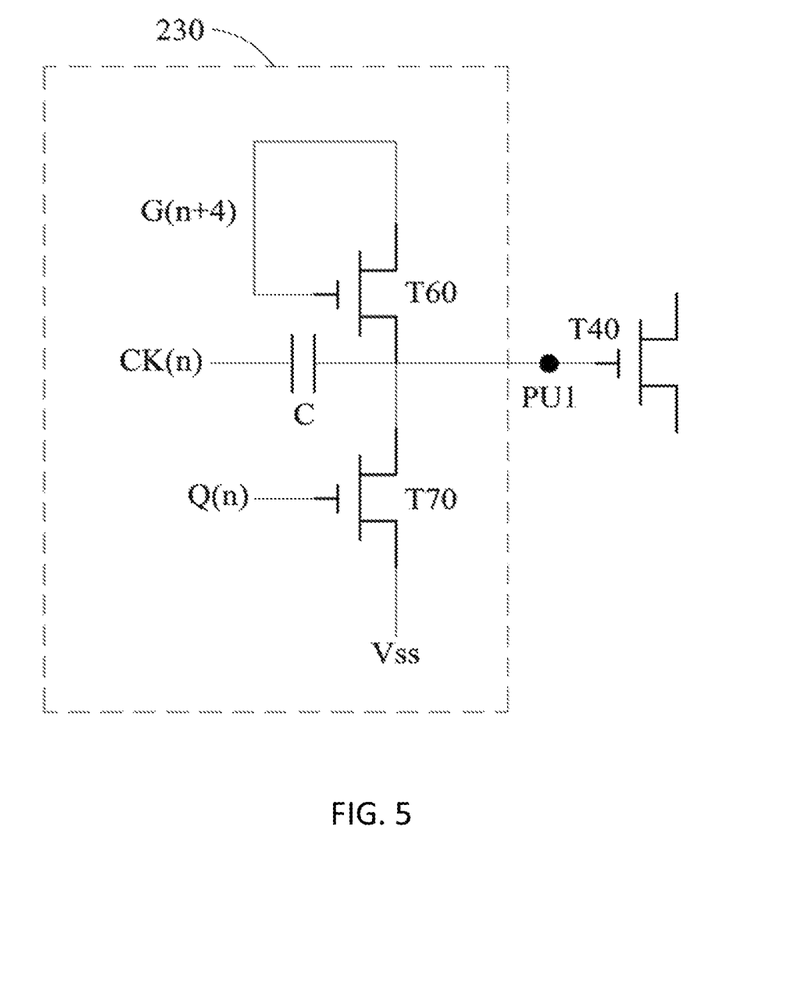
FIG. 5 shows a pull-down control circuit according to an embodiment of the present invention.

FIG. 3 shows a shift register circuit according to an embodiment of the present invention. FIG. 4 shows a waveform diagram of a shift register circuit according to an embodiment of the present invention. FIG. 5 shows a pull-down control circuit according to an embodiment of the present invention. Please refer to FIGS. 3 to 5 simultaneously, in one embodiment of the present invention, a shift register circuit 20 comprises a plurality of shift registers, each shift register comprises: a first switch T10, wherein the first switch T10 includes a control end and a first end electrically coupled to a control signal F(n−2), and a second end electrically coupled to a first node Boost(n); a second switch T20, wherein the second switch T20 includes a control end electrically coupled to the first node Boost(n), a first end electrically coupled to a frequency signal CK(n), and a second end electrically coupled to a first output signal G(n); a third switch T30, wherein the third switch T30 includes a control end electrically coupled to a second output signal G(n+4), a first end electrically coupled to the first output signal G(n), and a second end electrically coupled to a low predetermined voltage level Vss; a fourth switch T40, wherein the fourth switch T40 includes a control end electrically coupled to a second node PU1, a first end electrically coupled to the first node Boost(n), and a second end electrically coupled to the low predetermined voltage level Vss; a fifth switch T50, wherein the fifth switch T50 includes a control end electrically coupled to the first node Boost(n), a first end electrically coupled to the frequency signal CK(n), and a second end electrically coupled to a third node F(n); and a pull-down control circuit 230, wherein the pull-down control circuit 230 is electrically coupled to the frequency signal CK(n), the low predetermined voltage level Vss and the second node PU1, as shown in FIG. 5.

In one embodiment of the present invention, the pull-down control circuit 230 further comprises: a sixth switch T60, wherein the sixth switch T60 includes a control end and a first end electrically coupled to the second output signal G(n+4), and a second end electrically coupled to the second node PU1.

In one embodiment of the present invention, the pull-down control circuit 230 further comprises: a seventh switch T70, wherein the seventh switch T70 includes a control end electrically coupled to a fourth node Q(n), a first end electrically coupled to the second node PU1, and a second end electrically coupled to the low predetermined voltage level Vss.

In one embodiment of the present invention, the pull-down control circuit 230 further comprises: a first capacitor C, wherein the first capacitor C is electrically coupled to the frequency signal CK(n) and the second node PU1.

In one embodiment of the present invention, the first capacitor C stores electric charge for maintaining the voltage level of the second node PU1 at a voltage level to eliminate the interference signal 110 for sure.

In one embodiment of the present invention, the shift register circuit further comprises: a sub-pull-down circuit 220 electrically coupled to the first node Boost(n), the first output signal G(n) and the low predetermined voltage level Vss of the shift register.

In one embodiment of the present invention, the shift register circuit further comprises: a sub-pull-down circuit controller 210 electrically coupled to the sub-pull-down circuit 220 and the low predetermined voltage level Vss of the shift register.

In one embodiment of the present invention, the pull-down control circuit 230 is used for eliminating the interference signal 110 of the shift register.

In one embodiment of the present invention, when a frequency signal CK4 is coupled to first node Boost4 to generate an interference signal 110, by way of the design of the pull-down control circuit 230 and the coupling effects of the frequency signal CK(n), the second node PU1 is pulled high to a high voltage level H and the fourth switch T40 is turned on, so that the interference signal 110 of the first node Boost4 is conducted to the low predetermined voltage level Vss through the fourth switch T40, and the second node PU1 can be kept at a high voltage level state through the first capacitor C. Therefore, the interference signal 110 can be totally eliminated. Then, the second node PU1 is pulled down to a low voltage level to make sure the display is normal and to improve display quality.

Figure 6:
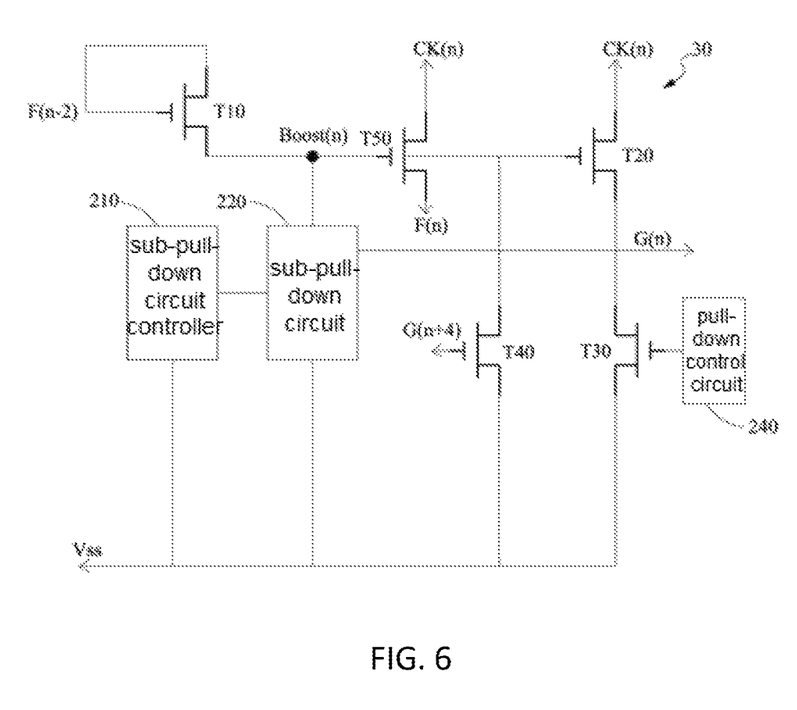
FIG. 6 shows a shift register circuit according to another embodiment of the present invention.
Figure 7:
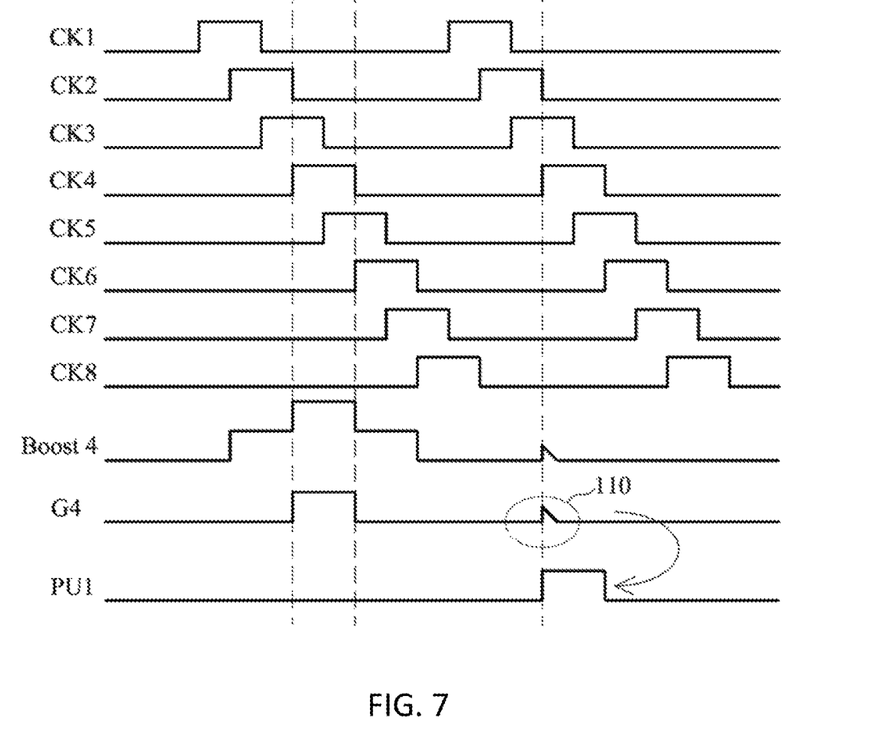
FIG. 7 shows a waveform diagram of a shift register circuit according to another embodiment of the present invention.
Figure 8:
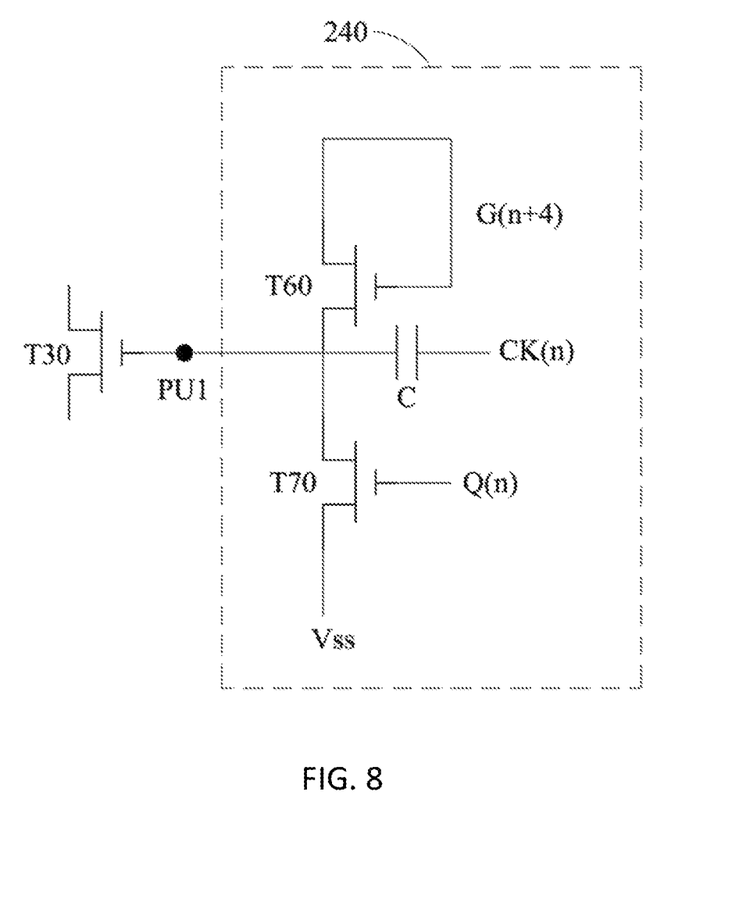
FIG. 8 shows a pull-down control circuit according to another embodiment of the present invention.

FIG. 6 shows a shift register circuit according to another embodiment of the present invention. FIG. 7 shows a waveform diagram of a shift register circuit according to another embodiment of the present invention. FIG. 8 shows a pull-down control circuit according to another embodiment of the present invention. Please refer to FIGS. 6 to 8 simultaneously, in one embodiment of the present invention, a shift register circuit 30 comprises a plurality of shift registers, each shift register comprises: a first switch T10, wherein the first switch T10 includes a control end and a first end electrically coupled to a control signal F(n−2), and a second end electrically coupled to a first node Boost(n); a second switch T20, wherein the second switch T20 includes a control end electrically coupled to the first node Boost(n), a first end electrically coupled to a frequency signal CK(n), and a second end electrically coupled to a first output signal G(n); a third switch T30, wherein the third switch T30 includes a control end electrically coupled to a second node PU1, a first end electrically coupled to the first output signal G(n), and a second end electrically coupled to a low predetermined voltage level Vss; a fourth switch T40, wherein the fourth switch T40 includes a control end electrically coupled to a second output signal G(n+4), a first end electrically coupled to the first node Boost(n), and a second end electrically coupled to the low predetermined voltage level Vss; a fifth switch T50, wherein the fifth switch T50 includes a control end electrically coupled to the first node Boost(n), a first end electrically coupled to the frequency signal CK(n), and a second end electrically coupled to a third node F(n); and a pull-down control circuit 240, wherein the pull-down control circuit 240 is electrically coupled to the frequency signal CK(n), the low predetermined voltage level Vss and the second node PU1, as shown in FIG. 8.

In one embodiment of the present invention, the pull-down control circuit 240 further comprises: a sixth switch T60. Wherein the sixth switch T60 includes a control end and a first end electrically coupled to the second output signal G(n+4), and a second end electrically coupled to the second node PU1.

In one embodiment of the present invention, the pull-down control circuit 240 further comprises: a seventh switch T70, wherein the seventh switch T70 includes a control end electrically coupled to fourth node Q(n), a first end electrically coupled to the second node PU1, and a second end electrically coupled to the low predetermined voltage level Vss.

In one embodiment of the present invention, the pull-down control circuit 240 further comprises: a first capacitor C, wherein the first capacitor C is electrically coupled to the frequency signal CK(n) and the second node PU1.

In one embodiment of the present invention, the first capacitor C stores electric charge for maintaining the voltage level of the second node PU1 at a voltage level to eliminate the interference signal 110 for sure.

In one embodiment of the present invention, the shift register circuit further comprises: a sub-pull-down circuit 220 electrically coupled to the first node Boost(n), the first output signal G(n) and the low predetermined voltage level Vss of the shift register.

In one embodiment of the present invention, the shift register circuit further comprises: a sub-pull-down circuit controller 210 electrically coupled to the sub-pull-down circuit 220 and the low predetermined voltage level Vss of the shift register.

In one embodiment of the present invention, the pull-down control circuit 240 is used for eliminating the interference signal 110 of the shift register.

In one embodiment of the present invention, when a frequency signal CK4 is coupled to first node Boost4 to generate an interference signal 110, by way of the design of the pull-down control circuit 230 and the coupling effects of the frequency signal CK(n), the second node PU1 is pulled high to a high voltage level H and the fourth switch T30 is turned on, so that the interference signal 110 of the first node Boost4 is conducted to the low predetermined voltage level Vss through the fourth switch T30, and the second node PU1 can be kept at a high voltage level state through first capacitor C. Therefore, the interference signal 110 can be totally eliminated. Then, the second node PU1 is pulled down to a low voltage level to make sure display is normal and to improve display quality.

Figure 9:
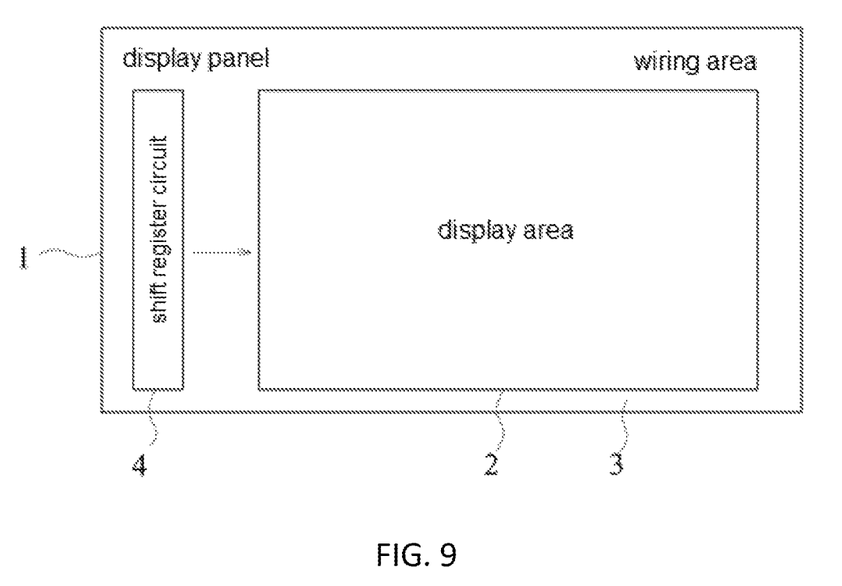
FIG. 9 shows a block diagram of a display panel according to an embodiment of the present invention.

FIG. 9 shows a block diagram of a display panel according to an embodiment of the present invention. Please refer to FIGS. 3 to 9, in one embodiment of the present invention, a display panel 1 comprises: a display area 2, a wiring area 3, and a shift register circuit 4, wherein the shift register circuit 4 comprises all of the technical features of the above-mentioned shift register circuit (20, 30) disposed on the wiring area 3 of the display panel 1.

In some embodiments of the present invention, the display panel 1 can be but not limited to, for example, a liquid crystal display panel. The present display panel 1 can be also an OLED display panel, a W-OLED display panel, a QLED display panel, a plasma display panel, a curved-surface display panel or other type display panels.

The present invention uses a pull-down control circuit (230, 240) and coupling effects of a frequency signal CK(n) to form a switch signal for controlling an operation status of the active switch (T30, T40), so that an interference signal 110 in circuits can be eliminated to avoid displaying an abnormal image.

"In some embodiments of the present invention" and "In a variety of embodiments of the present invention" are used repeatedly through the description. They usually mean different embodiments. However, they can also mean the same embodiments. "Comprising", "having" and "including" are synonyms, except it is noted to be different or has other meanings before and after its description.

The present invention has been described in considerable detail with reference to certain preferred embodiments thereof. It should be understood that the description is for illustrative purpose, not for limiting the scope of the present invention. Those skilled in this art can readily conceive simple or equivalent variations and modifications, which are still within the spirit of the present invention. The protection scope of the present invention shall be subject to the accompanying claims

What is claimed is:

1. A shift register circuit, comprising a plurality of shift registers, wherein each shift register comprises:
    a first switch including a control end and a first end electrically coupled to a control signal, and a second end electrically coupled to a first node;
    a second switch including a control end electrically coupled to the first node, a first end electrically coupled to a frequency signal, and a second end electrically coupled to a first output signal;
    a third switch including a control end electrically coupled to a second node, a first end electrically coupled to the first output signal, and a second end electrically coupled to a low predetermined voltage level;
    a fourth switch including a control end electrically coupled to a second output signal, a first end electrically coupled to the first node, and a second end electrically coupled to the low predetermined voltage level;
    a fifth switch including a control end electrically coupled to the first node, a first end electrically coupled to the frequency signal, and a second end electrically coupled to a third node; and
    a pull-down control circuit electrically coupled to the frequency signal, the low predetermined voltage level and the second node, the pull-down control circuit comprising:
        a sixth switch including a control end and a first end electrically coupled to the second output signal, and a second end electrically coupled to the second node; and
        a first capacitor electrically coupled to the frequency signal and the second node.

2. The shift register circuit according to claim 1, wherein the pull-down control circuit further comprises: a seventh switch including a control end electrically coupled to a fourth node, a first end electrically coupled to the second node, and a second end electrically coupled to the low predetermined voltage level.

3. The shift register circuit according to claim 1, wherein the first capacitor stores electric charge for maintaining the voltage level of the second node at a voltage level.

4. The shift register circuit according to claim 1, further comprising: a sub-pull-down circuit electrically coupled to the first node, the first output signal, and the low predetermined voltage level of the shift register.

5. The shift register circuit according to claim 4, further comprising: a sub-pull-down circuit controller electrically coupled to the sub-pull-down circuit and the low predetermined voltage level of the shift register.

6. The shift register circuit according to claim 1, wherein an operation status of the third switch is controlled and an interference signal of the shift register is eliminated through the pull-down control circuit.

7. A shift register circuit comprising a plurality of shift registers, wherein each shift register comprises:
    a first switch including a control end and a first end electrically coupled to a control signal, and a second end electrically coupled to a first node;
    a second switch including a control end electrically coupled to the first node, a first end electrically coupled to a frequency signal, and a second end electrically coupled to a first output signal;
    a third switch including a control end electrically coupled to a second node, a first end electrically coupled to the first output signal, and a second end electrically coupled to a low predetermined voltage level;
    a fourth switch including a control end electrically couple to a second output signal, a first end electrically coupled to the first node, and a second end electrically coupled to the low predetermined voltage level;
    a fifth switch including a control end electrically coupled to the first node, a first end electrically coupled to the frequency signal, and a second end electrically coupled to a third node; and
    a pull-down control circuit comprising:
    a sixth switch including a control end and a first end electrically coupled to the second output signal, and a second end electrically coupled to the second node;
    a seventh switch including a control end electrically coupled to a fourth node, a first end electrically coupled to the second node, and a second end electrically coupled to the low predetermined voltage level; and
    a first capacitor electrically coupled to the frequency signal and the second node;
    wherein an operation status of the third switch is controlled and an interference signal of the shift register is eliminated through the pull-down control circuit.

8. A display panel comprising a shift register circuit, the shift register circuit comprising a plurality of shift registers, wherein each shift register comprises:
- a first switch including a control end and a first end electrically coupled to a control signal, and a second end electrically coupled to a first node;
- a second switch including a control end electrically coupled to the first node, a first end electrically coupled to a frequency signal, and a second end electrically coupled to a first output signal;
- a third switch including a control end electrically coupled to a second node, a first end electrically coupled to the first output signal, and a second end electrically coupled to a low predetermined voltage level;
- a fourth switch including a control end electrically coupled to a second output signal, a first end electrically coupled to the first node, and a second end electrically coupled to the low predetermined voltage level;
- a fifth switch including a control end electrically coupled to the first node, a first end electrically coupled to the frequency signal, and a second end electrically coupled to a third node; and
- a pull-down control circuit electrically coupled to the frequency signal, the low predetermined voltage level and the second node, the pull-down control circuit comprising:
  - a sixth switch including a control end and a first end electrically coupled to the second output signal; and
  - a first capacitor electrically coupled to the frequency signal and the second node.

9. The display panel according to claim 8, wherein the sixth switch includes a second end electrically coupled to the second node.

10. The display panel according to claim 8, wherein the pull-down control circuit further comprises: a seventh switch including a control end electrically coupled to a fourth node.

11. The display panel according to claim 10, wherein the seventh switch includes a first end electrically coupled to the second node.

12. The display panel according to claim 11, wherein the seventh switch includes a second end electrically coupled to the low predetermined voltage level.

13. The display panel according to claim 8, wherein the first capacitor stores electric charge for maintaining the voltage level of the second node at a voltage level.

14. The display panel according to claim 8, further comprising: a sub-pull-down circuit electrically coupled to the first node, the first output signal and the low predetermined voltage level of the shift register.

15. The display panel according to claim 14, further comprising: a sub-pull-down circuit controller electrically coupled to the sub-pull-down circuit and the low predetermined voltage level of the shift register.

16. The display panel according to claim 8, wherein an operation status of the third switch is controlled and an interference signal of the shift register is eliminated through the pull-down control circuit.

* * * * *